(12) United States Patent
Sasaki

(10) Patent No.: US 8,644,038 B2
(45) Date of Patent: Feb. 4, 2014

(54) CURRENT DETECTION CIRCUIT FOR A POWER SEMICONDUCTOR DEVICE

(75) Inventor: Masahiro Sasaki, Azumino (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 292 days.

(21) Appl. No.: 13/278,957

(22) Filed: Oct. 21, 2011

(65) Prior Publication Data

US 2012/0098573 A1    Apr. 26, 2012

(30) Foreign Application Priority Data

Oct. 22, 2010  (JP) ................................ 2010-237437

(51) Int. Cl.
*H02H 7/122*    (2006.01)

(52) U.S. Cl.
USPC ...................................... 363/56.03; 361/93.2

(58) Field of Classification Search
USPC ............. 363/16, 20, 49, 50, 56.01–56.09, 58,
363/65; 327/312, 313, 380, 387, 439, 480,
327/577; 323/265–266, 268, 277, 280,
323/282–288, 312; 361/87.03, 91.1, 93.1,
361/93.394, 100
See application file for complete search history.

(56) References Cited

U.S. PATENT DOCUMENTS

| | | | | |
|---|---|---|---|---|
| 4,777,578 | A * | 10/1988 | Jahns | ............................... 363/98 |
| 4,926,104 | A * | 5/1990 | King et al. | ..................... 318/599 |
| 5,245,523 | A * | 9/1993 | Juzswik | ....................... 363/56.03 |
| 6,678,180 | B2 * | 1/2004 | Matsuda | ........................ 363/132 |
| 2008/0100978 | A1 | 5/2008 | Maebara et al. | |
| 2009/0057832 | A1 | 3/2009 | Kouno | |

FOREIGN PATENT DOCUMENTS

| | | |
|---|---|---|
| JP | 64-66970 | 3/1989 |
| JP | 02-130951 A | 5/1990 |
| JP | 05-259853 A | 10/1993 |
| JP | 07-146722 A | 6/1995 |
| JP | 09-172359 A | 6/1997 |
| JP | 10-032476 A | 2/1998 |
| JP | 10-326897 A | 12/1998 |
| JP | 11-235015 A | 8/1999 |
| JP | 2000-134955 A | 5/2000 |
| JP | 2003-274667 A | 9/2003 |
| JP | 2005-050913 A | 2/2005 |
| JP | 2006-211834 A | 8/2006 |
| JP | 2006-271098 A | 10/2006 |
| JP | 2007-049870 A | 2/2007 |
| JP | 2007-194660 A | 8/2007 |
| JP | 2008-005217 A | 1/2008 |
| JP | 2008-136335 A | 6/2008 |
| JP | 2009-268336 A | 11/2009 |
| JP | 2010-004728 A | 1/2010 |
| JP | 2010-199279 A | 9/2010 |

* cited by examiner

*Primary Examiner* — Rajnikant Patel
(74) *Attorney, Agent, or Firm* — Rabin & Berdo, P.C.

(57) ABSTRACT

A current detection circuit for a power semiconductor device utilizes a sense function of the power semiconductor device. The magnitude of current flowing in power semiconductor devices 1, 11 is detected by a current-voltage conversion circuit 24 connected to sense terminals S, S of the power semiconductor devices. The detected signal is delivered to a current direction detection circuit 27, which detects the direction of the current and delivers the detected current direction signal to an external CPU 3, which in turn gives gain-setting and offset-setting signals corresponding to the current direction signal. An output gain adjuster 221 adjusts the magnitude of gain and an output offset adjuster 231 adjusts the magnitude of offset to correct for differences between the characteristics of the sense regions and the main regions of the power semiconductor devices.

5 Claims, 11 Drawing Sheets

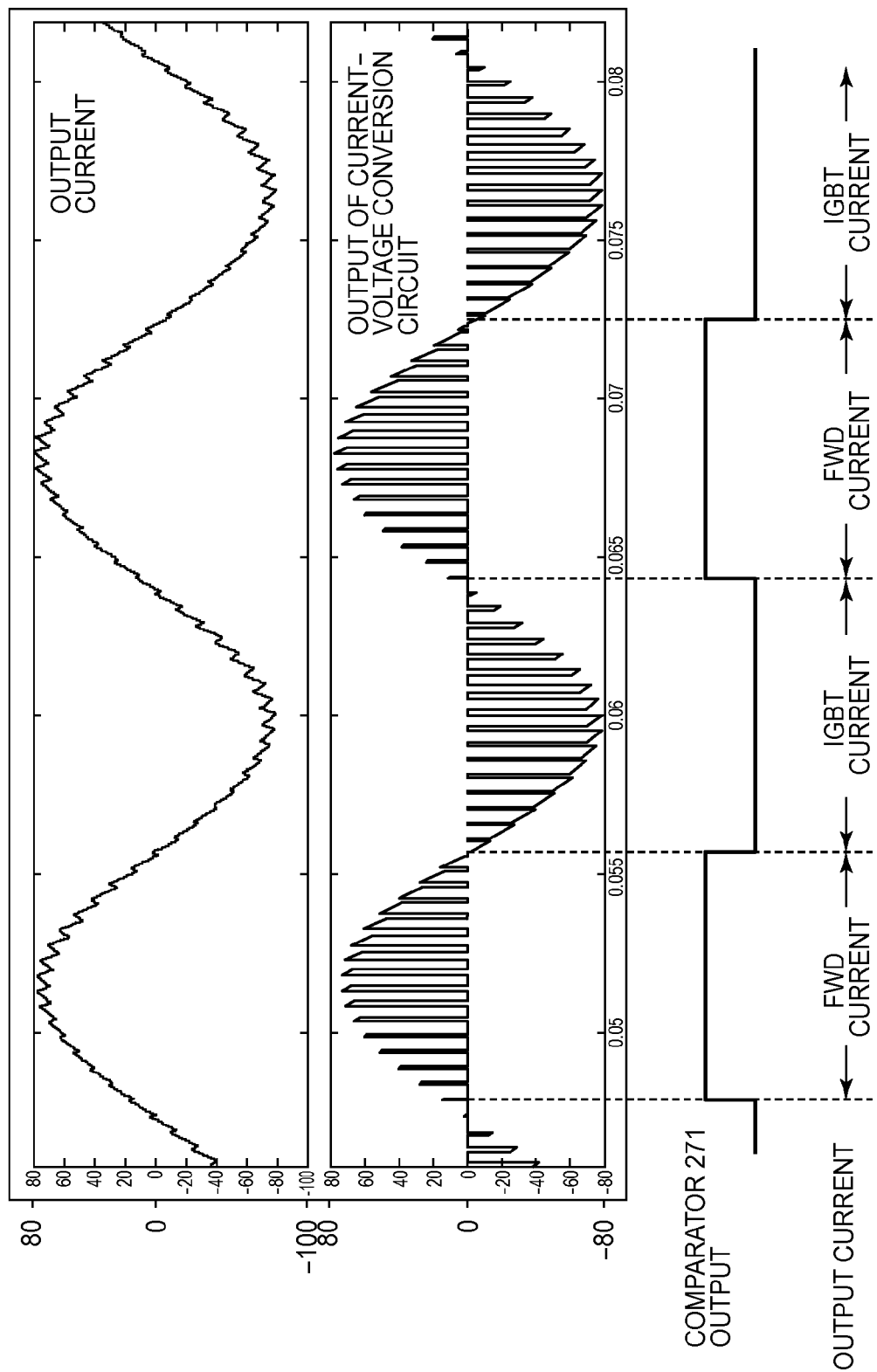

CIRCUIT SYMBOLS

EQUIVALENT CIRCUIT

CURRENT DETECTION CIRCUIT FOR A POWER SEMICONDUCTOR DEVICE

CROSS-REFERENCE TO RELATED APPLICATION

This application is based on, and claims priority of, Japanese Patent Application 2010-237437, filed on Oct. 22, 2010, the contents of which are incorporated herein by reference.

BACKGROUND OF THE INVENTION

1. Field of the Invention

The present invention relates to a current detection circuit for a power semiconductor device, and in particular to a current detection circuit for detecting a current running in a power semiconductor device such as a diode or a transistor, for example, a bipolar transistor, a MOSFET (metal oxide semiconductor field effect transistor), or an IGBT (insulated gate bipolar transistor).

2. Description of the Related Art

An IGBT module installing an IGBT and a free wheeling diode (hereinafter referred to simply as an FWD), which are types of power semiconductor devices, is used in a power conversion apparatus such as an inverter or a DC (direct current) chopper circuit.

In order to control a circuit of such a power conversion apparatus, generally an output current must be detected. For the output current detection, the following two methods are usually employed.
(1) A method using a current detection device for example, a current transformer or a DCCT (direct-current current-transformer).
(2) A method using a resistor called a shunt resistor for current detection.

FIG. 4 shows an example of construction of a conventional three phase inverter apparatus using DCCTs. Referring to FIG. 4, the DCCTs 105 utilize a magnetic core with a ring shape and a Hall element as shown in FIG. 18 in Patent Document 3, in which the electric current is detected by detecting a magnetic field generated by the current flowing in the main circuit wiring passing through the magnetic core. The inverter 101 shown in FIG. 4 is provided with the DCCTs 105 that are disposed around the main output wiring and a control circuit 102 that receives the detected current value.

FIG. 5 shows a relationship among an output current, an IGBT current and an FWD current in the lower arm of one phase of the inverter apparatus shown in FIG. 4. Provided that the direction of the output current is positive when the current flows out of the inverter apparatus, a positive current flows in the FWD 202 of the lower arm of the inverter apparatus and then a negative current flows in the IGBT 201 of the lower arm of the inverter apparatus as shown in the right side of FIG. 4. Here, the negative current is an electric current drawn into the inverter apparatus. The output current is repetition of these positive and negative currents.

Of the IGBTs and FWDs composing an inverter apparatus, there are types of IGBTs and FWDs called 'sense IGBTs' and 'sense FWDs' that perform a current detection function. The following describes a function of an example of a semiconductor device, specifically an IGBT element, with a sense function. FIGS. 6(a) and 6(b) show circuit symbols (FIG. 6(a)) and equivalent circuits (FIG. 6(b)) of the IGBT element with a sense function. The circuit symbols are represented as those in FIG. 6(a) and the equivalent circuits are represented by those in FIG. 6(b).

An ordinary IGBT consists of several thousand to several tens of thousands of cells having the same structure. A portion of the cells are utilized for current detection. The portion of the IGBT cells for current detection is called as 'a sense region' and the other IGBT cells are called as 'a main region'. In general, a ratio Nm/Ns of the number of cells Nm in a main region to the number of cells Ns in a sense region is set to several thousands, wherein Nm and Ns are positive integers. Although collector terminals of the main region and collector terminals of the sense region are made in common, emitter terminals are separated to a main emitter terminal (referred to simply as a main terminal) and a sense emitter terminal for current detection (referred to simply as a sense terminal).

Likewise, in the case of an FWD, a portion of the FWD chips is separated for current detection; anode terminals are separated to a main anode terminal (simply referred to as a main terminal) and an anode terminal for current detection (simply referred to as a sense terminal). An equivalent circuit of an FWD including a sense FWD is similar to the one as shown in FIG. 6(b) for an IGBT including a sense IGBT. The symbols in FIG. 6(b) for a sense IGBT are changed for the sense FWD to: an internal resistance of the main region Rdm0, an internal resistance of the sense region Rds0, a threshold voltage of the main region Rdthm0, and a threshold voltage of the sense region Vdths0.

FIG. 7 shows simulation waveforms of an output current and currents in the IGBT and the FWD in one phase of the inverter apparatus of FIG. 4. The waveform of electric current includes: an output current, an electric current flowing in the IGBT of the lower arm, and an electric current flowing in the FWD of the lower arm. As shown in FIG. 7, the current in the IGBT of the lower arm flows only when the output current is negative, that is, in the direction of current being drawn into the inverter apparatus. On the other hand, the current in the FWD of the lower arm flows only when the output current is positive, that is, in the direction of current being flowing out from the inverter apparatus. Negative output current is never generated at the time when positive output current is generated; and positive output current is never generated at the time when negative output current is generated.

FIG. 8 shows a conventional example of the construction of an inverter apparatus that uses a current detection circuit employing shunt resistors 106 commonly for both IGBTs 201 and FWDs 202. The current detection circuit of FIG. 8 has the shunt resistors 106 connected in the lower arm of the inverter 101. The output current flows in the lower arm when the IGBT 201 in the lower arm is in the ON state, and a voltage drop in the shunt resistor 106 is detected by the control circuit 102 to detect the output current. A current detection circuit employing a shunt resistor is disclosed in Patent Document 1 (identified below), for example.

FIG. 9 shows a conventional example of the construction of an inverter apparatus that uses a current detection circuit employing shunt resistors 106 for IGBTs 203 with a sense function and further shunt resistors 106 for FWDs 204 with a sense function. This current detection circuit is provided with a shunt resistor 106 for each sense IGBT 203 and another shunt resistor 106 for each sense FWD 204. The current flowing in the shunt resistors 106 is detected and delivered to the control circuit 102. This type of current detection circuit is disclosed in Patent Documents 2 and 3 (identified below), for example. The shunt resistors 106 are individually connected to the sense IGBTs 203 and the FWDs 204 in the lower arm of the inverter 101 as shown in FIG. 9. The output current flows through the IGBTs 203 of the lower arm to the ground when the IGBTs 203 in the lower arm are in the ON state. The voltage drop in the shunt resistors 106 is delivered to the control circuit 102 to detect the output current. The output current flows through the FWDs 204 of the lower arm to the motor 104 when the FWDs 204 are in the ON state. The voltage drops across the shunt resistors 106 are delivered to the control circuit 102 to detect the output current.

In the ON state of the IGBTs 203 of the lower arm, an electric current flows through the sense terminal of the IGBT 203 corresponding, in principle, to the ratio of number of cells Nm/Ns as shown in Formula 1 below.

$$Im/Is=(Nm+Ns)/Ns \approx Nm/Ns \quad \text{(Formula 1)}$$

where
Im is a main current, that is, the current flowing in the main IGBT,
Is is a sense current, that is, the current flowing in the sense IGBT,
Nm is the number of cells in the main region, and
Ns is the number of cells in the sense region.

The sense current Is is detected by the shunt resistor Rs connected to the sense terminal of the IGBT 203 as shown in FIG. 9, and the main current Im is calculated based on Formula 2 below.

$$Im = (Nm/Ns) \cdot Is \quad \text{(Formula 2)}$$
$$= (Nm/Ns) \cdot (Vs/Rs)$$

The method of detecting a main current Im using a shunt resistor Rs carrying the main current has a problem of a large loss in the shunt resistor. However, the above described method generates an insignificant loss in the shunt resistor, thus, eliminating the problems of decreased efficiency and enlarged resistor size.

Nevertheless, this method still has a problem of precision in the current detection. Inverter control generally requires a current detection precision of 1 to 2%. The method using the shunt resistor connected to the sense region exhibits such a low precision that cannot fill the above-mentioned requirement for current detection precision.

The low precision may be caused by the following two factors.

(a) A Factor of Difference in Characteristics of the Main Region and the Sense Region.

Equality between the ratio of magnitudes of current and the ratio of numbers of cells is only valid under the assumption that the cell characteristics are identical between the main region and the sense region. Actually, the characteristics are various and the ratio of the main current to the sense current is not constant. Thus, linear relationship cannot be supposed between the main current and the sense current.

(b) A Factor of a Shunt Resistance Effect

A voltage drop develops due to an electric current in the shunt resistor Rs connected to the sense terminal. As a result, an electric potential difference arises between the main terminal and the sense terminal, disturbing a constant ratio of the main current to the sense current.

FIG. 10 is a block diagram showing a construction of one phase portion of the inverter apparatus including the current detection circuit employing shunt resistors shown in FIG. 9. In the construction of FIG. 10, current detection circuits 210 employing a shunt resistor are connected to the sense terminal of the sense IGBT 203 and to the sense terminal of the sense FWD 204 in the lower arm.

[Patent Document 1] Japanese Unexamined Patent Application Publication No. 2003-274667 (FIG. 7, in particular)

[Patent Document 2] Japanese Unexamined Patent Application Publication No. 2009-268336 (FIG. 1, in particular)

[Patent Document 3] Japanese Unexamined Patent Application Publication No. 2000-134955 (FIG. 1 and FIG. 18, in particular)

The conventional current detection methods described above have the following problems. The current detection method employing DCCTs as shown in FIG. 4 has problems that the method is generally expensive due to use of a Hall sensor element and a magnetic core, and that the output characteristics changes due to temperature variation around the DCCTs. Additional problem is that the size of the detector is large due to use of the magnetic core, which poses limitation on size reduction of a power conversion apparatus.

The current detection method employing a shunt resistor as shown in FIG. 8 has a problem that a power loss is generated in the shunt resistor, which decreases a power conversion efficiency of a power conversion apparatus. Additional problem is that the size of the resistor itself becomes large in order to allow a large loss, which poses limitation on size reduction of a power conversion apparatus.

The current detection method employing shunt resistors as shown in FIG. 9 has another problem that electric current measurement with high precision is impossible due to difference between the characteristic of the sense IGBT and the characteristic of the main IGBT. Also between the characteristic of the sense FWD and that of the main FWD.

SUMMARY OF THE INVENTION

In view of the above-described problems, it is an object of the present invention to solve the problems which include:
(1) to prevent increase in a size and a loss, which may result by employing a DCCT or a shunt resistor;
(2) to prevent decrease in current detection precision, which may result by utilizing a power semiconductor device with a sense function; and
(3) to accomplish digital control and suppress circuit scale in a correction circuit for improving current detection precision in a current detection circuit employing a power semiconductor device with a sense function.

More specifically, the problem to be solved by the present invention includes:
(a) to obtain a current detection circuit with a small size and a low loss by detecting a current utilizing a sense function of a power semiconductor device with a sense function; the current detection circuit is
(b) to improve current detection precision by correcting linearity between the main current Im and the sense current Is in such a current detection circuit as described in the issue (a) above;
(c) to make the correction circuit for linearity correction to be digitally controlled and to have a practically feasible circuit scale; and
(d) to reduce a scale of a current detection circuit by employing a single common current detection circuit that has conventionally been composed of individual current detection circuits provided for detecting sense IGBT current and for detecting sense FWD current, while holding an improved current detection precision.

In order to solve the above-described problems, a current detection circuit for a power semiconductor device according to the present invention executes current detection of a power semiconductor device with a sense function including divided regions of a main region and a sense region for current detection and having a main terminal connected to the main region and a sense terminal connected to the sense region and to the current detection circuit.

The current detection circuit comprises: a current-voltage conversion circuit that receives a current to be detected and converts the current to a voltage signal, the current being delivered from the sense terminal; an output level regulator that regulates an output level of the current sense signal delivered from the current-voltage conversion circuit; a current direction detection circuit that detects a direction of a current flowing in the power semiconductor device with a sense function based on the current sense signal delivered from the current-voltage conversion circuit and gives the direction signal to an external CPU; a first variable voltage source circuit that generates a correction gain according to a gain-setting signal delivered by the CPU corresponding to the direction of the current flowing in the power semiconductor device with a sense function; a second variable voltage source circuit that generates a correction offset according to an offset-setting signal delivered by the CPU corresponding to the direction of the current flowing in the power semiconductor device with a sense function; and an adder circuit that adds an output of the first variable voltage source circuit and an output of the second variable voltage source circuit and gives an added result to the current-voltage conversion circuit; wherein an electric potential at the sense terminal is adjusted corresponding to the added result to perform correction for difference between a characteristic of the main region and a characteristic of the sense region.

The current direction detection circuit for a power semiconductor device preferably is composed of a comparator with a hysteresis function having two input terminals one of which is connected to the GND and the other is connected to the output of the current-voltage conversion circuit and detects the direction of the output current flowing in the power semiconductor device with a sense function corresponding to the output level of the current-voltage conversion circuit.

In the current detection circuit for a power semiconductor device, the power semiconductor device with a sense function is preferably either one of an IGBT with a sense function or an FWD with a sense function, and the CPU outputs a gain-setting signal and an offset-setting signal for the IGBT or outputs a gain-setting signal and an offset-setting signal for the FWD, to perform correction for difference between a characteristic of the main region and a characteristic of the sense region of the IGBT and correction for difference between a characteristic of the main region and a characteristic of the sense region of the FWD by means of the single current detection circuit.

According to a current detection circuit of the present invention, the direction of the output current is detected and correction parameters are adjusted corresponding to the detected result, thereby small size and low cost are achieved owing to reduction in circuit scale and number of parts. High precision current detection is attained as well.

An inverter apparatus to which a current detection circuit of the invention is applied needs to be provided with only one current detection circuit in one arm. Therefore, the circuit scale and the number of parts in an inverter apparatus are significantly reduced.

BRIEF DESCRIPTION OF DRAWINGS

FIG. 3 shows waveforms in operation of the current direction detection circuit indicated in FIG. 2 and a waveform of an output current;

Figure 1:
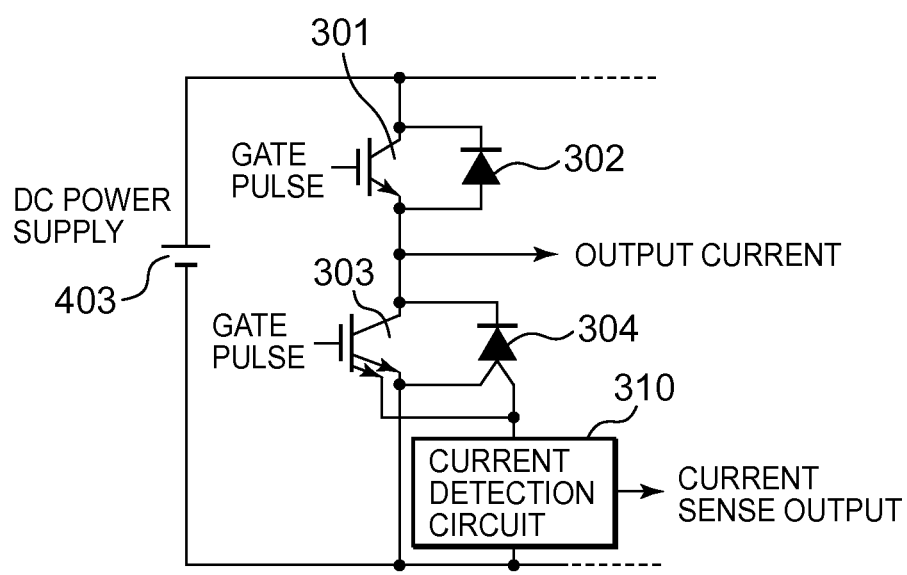
FIG. 1 shows a one phase portion of an inverter apparatus to which a current detection circuit for a power semiconductor device of an embodiment example according to the present invention is applied.

Various reference numbers that appear in the drawings are identified below.
1—IGBT element;
2, 310—current detection circuit;
3—CPU (central processing unit);
11—FWD element;
22—first variable voltage source circuit;
23—second variable voltage source circuit;
24—current-voltage conversion circuit;
25—output level regulator;
26—adder circuit;
27—current direction detection circuit;
101—inverter apparatus;
102—control circuit;
103, 403—DC power supply;
104—motor;
201, 301—IGBT;
202, 302—FWD;
203, 303—IGBT with a sense function;
204, 304—FWD with a sense function;
221—output (gain) adjuster;
231—output (offset) adjuster; and
271—hysteresis comparator.

DETAILED DESCRIPTION OF THE INVENTION

Some preferred embodiments according to the present invention will be described in detail in the following with reference to the accompanying drawings.

Figure 8:
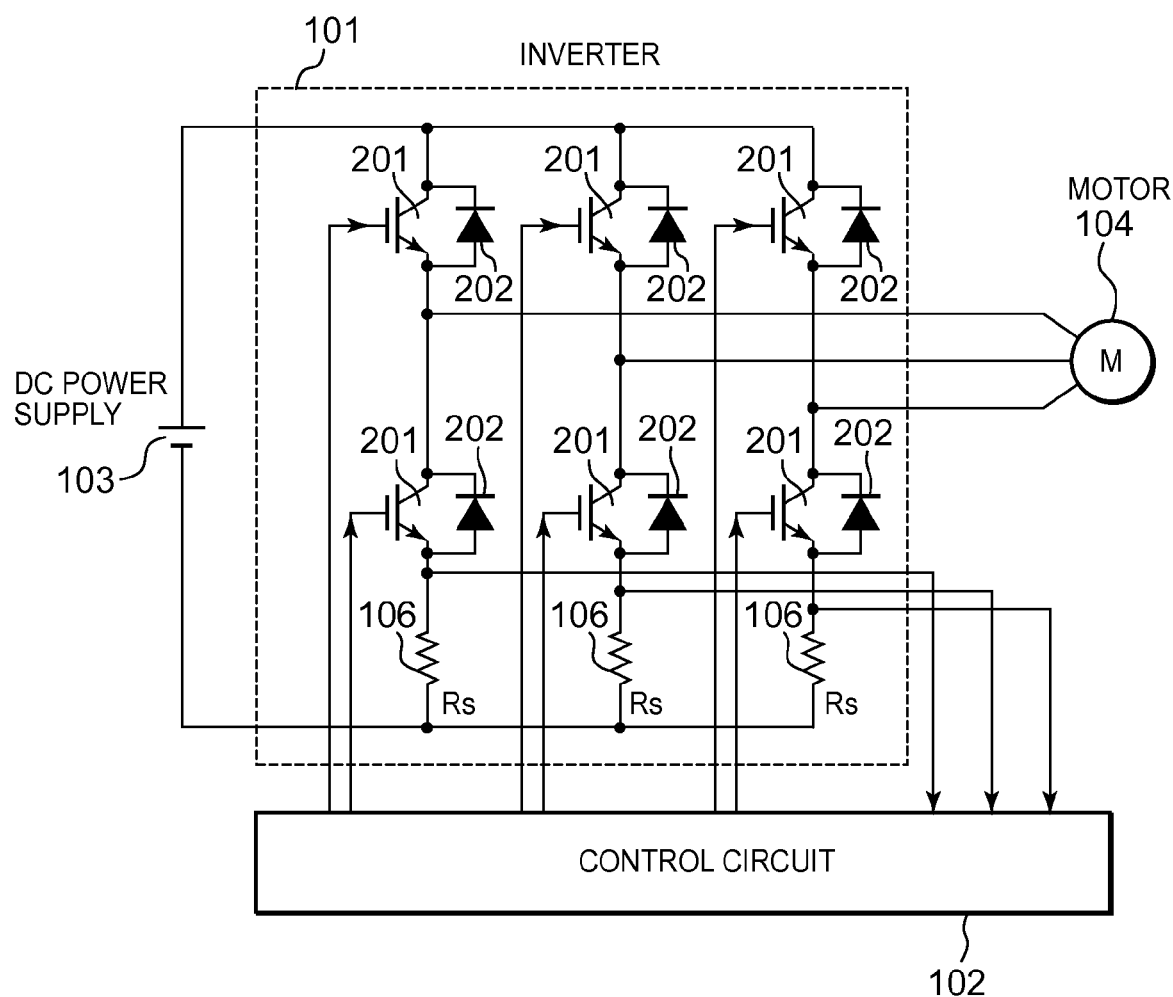
FIG. 8 shows a construction example of a conventional inverter apparatus to which a current detection circuit employing a shunt resistor is applied commonly for an IGBT and an FWD.
Figure 9:
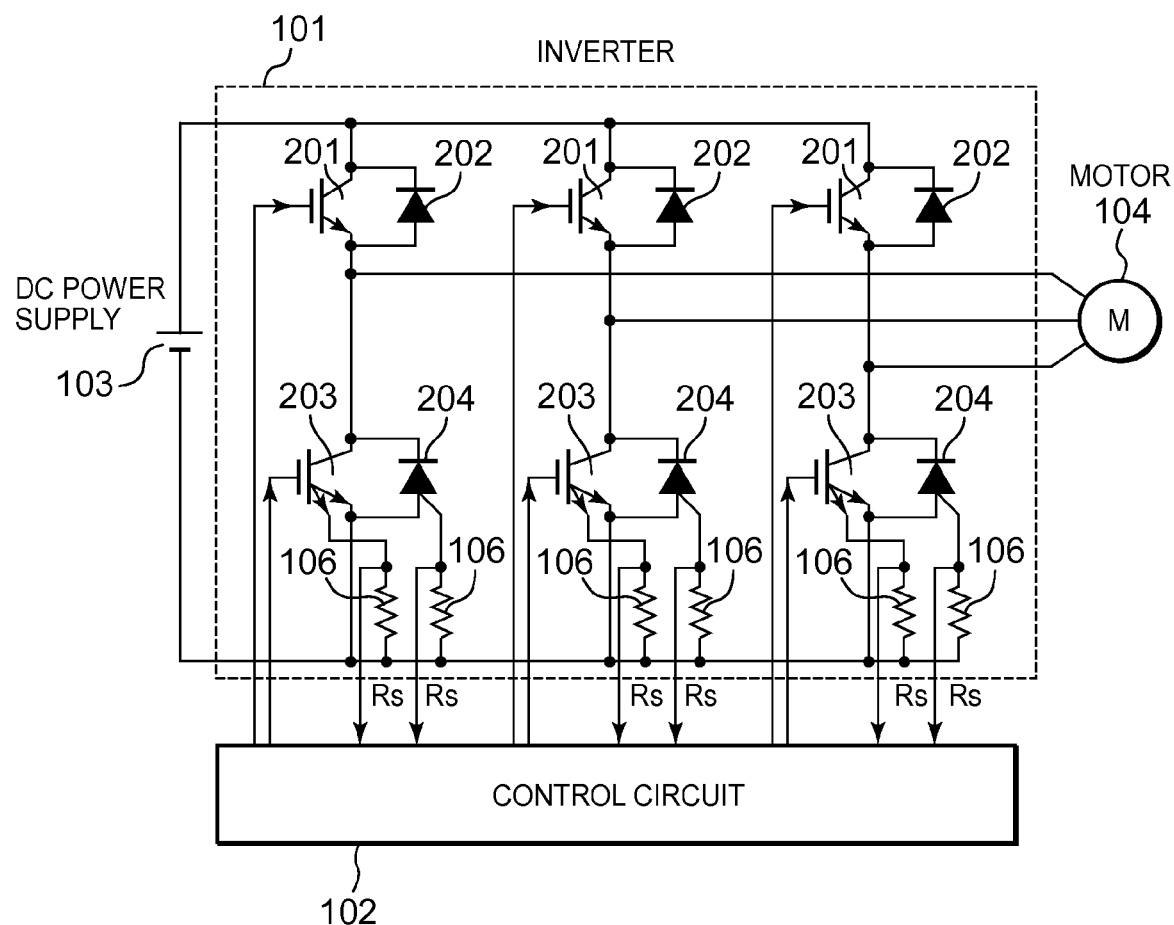
FIG. 9 shows a construction example of a conventional inverter apparatus to which current detection circuits employing a shunt resistor are applied individually for an IGBT and an FWD.
Figure 10:
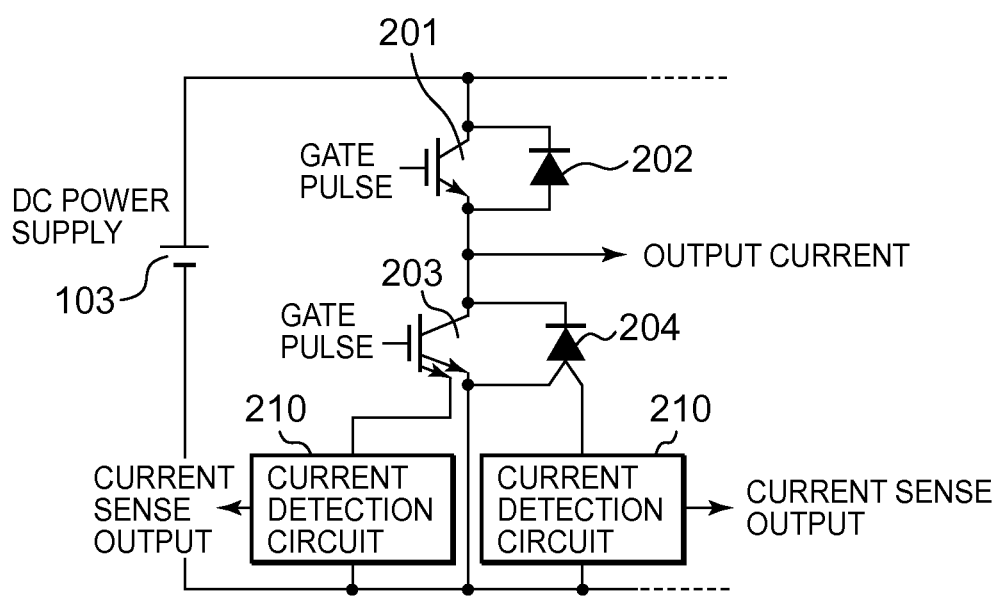
FIG. 10 is a block diagram showing a construction example of a one phase portion of the conventional inverter apparatus of FIG. 9 including two current detection circuits employing a shunt resistor.

FIG. 1 shows a one phase portion of an inverter apparatus to which a current detection circuit for a power semiconductor device according to an embodiment of the present invention is applied. If the current detection circuits having the conventional construction employing a shunt resistor(s) as shown in FIG. 8 and FIG. 9 are applied to the lower arm of an inverter apparatus shown in FIG. 1, a satisfactory current detection precision cannot be attained. The current detection in the one phase portion of the inverter apparatus can be carried out by using only one current detection circuit 310 according to the invention allowing attainment of a satisfactory current detection precision without using the two current detection circuits 210 with the conventional construction as shown in FIG. 10 or the conventional current detection circuits employing shunt resistors as shown in FIG. 9. The current detection circuit 310 of the invention shown in FIG. 1 is illustrated in detail in FIG. 2.

FIG. 1 shows a construction of a one phase portion of an inverter apparatus in which a series connected circuit of an IGBT element 301 and an IGBT element with a sense function 303 is connected between the terminals of a DC power supply 403. An FWD (free wheeling diode) 302 is connected between the collector and the emitter of the IGBT element 301, and an FWD 304 with a sense function is connected between the collector and the emitter of the IGBT element with a sense function 303. The current detection circuit 310 is connected between the connection point of the sense terminals and the ground. The current detection circuit 310 outputs a detected signal as a current sense output signal.

Figure 2A:
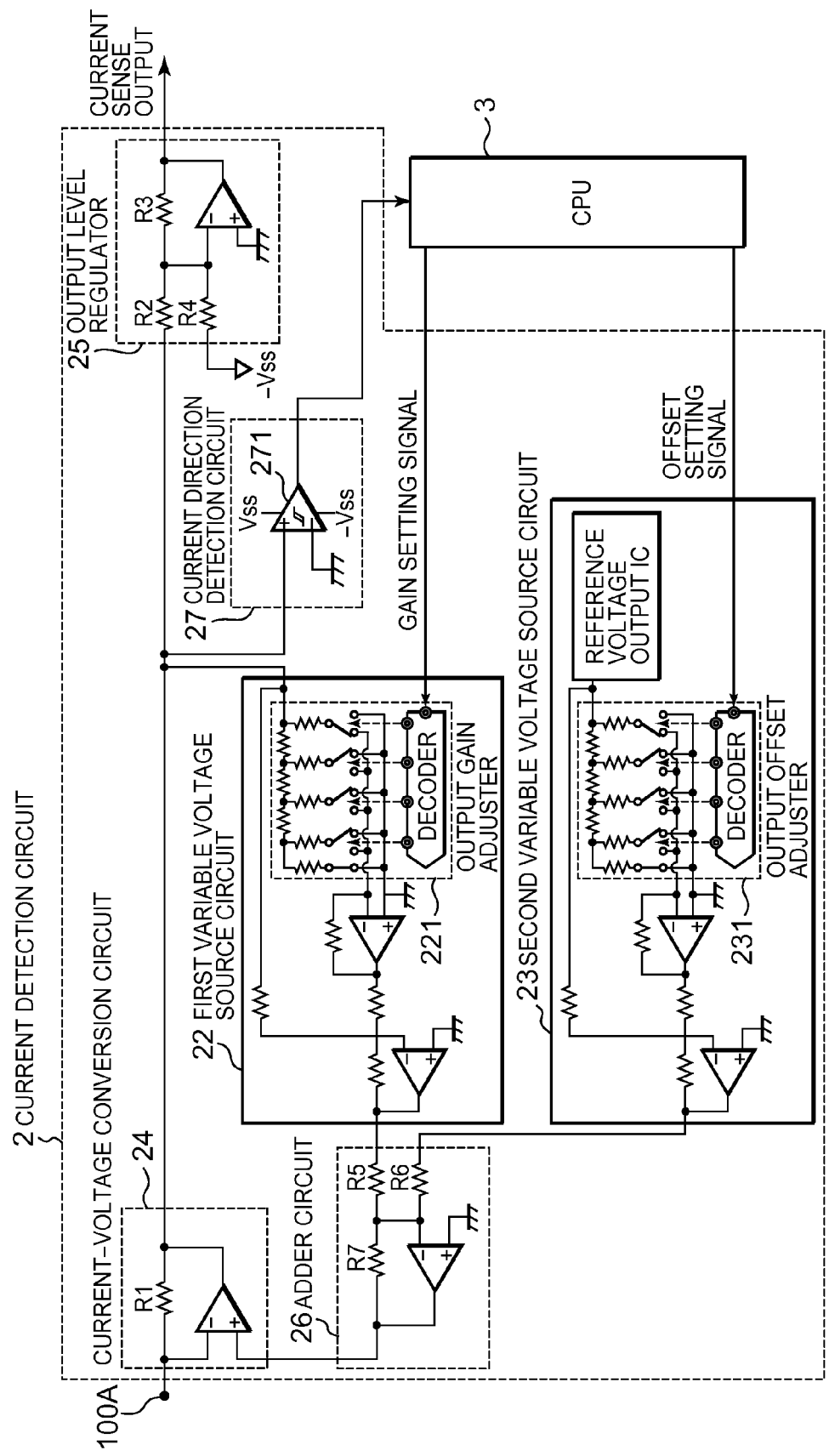
FIGS. 2A and 2B show the detailed construction of a current detection circuit for a power semiconductor device for one phase, of an embodiment example according to the present invention.
Figure 2B:
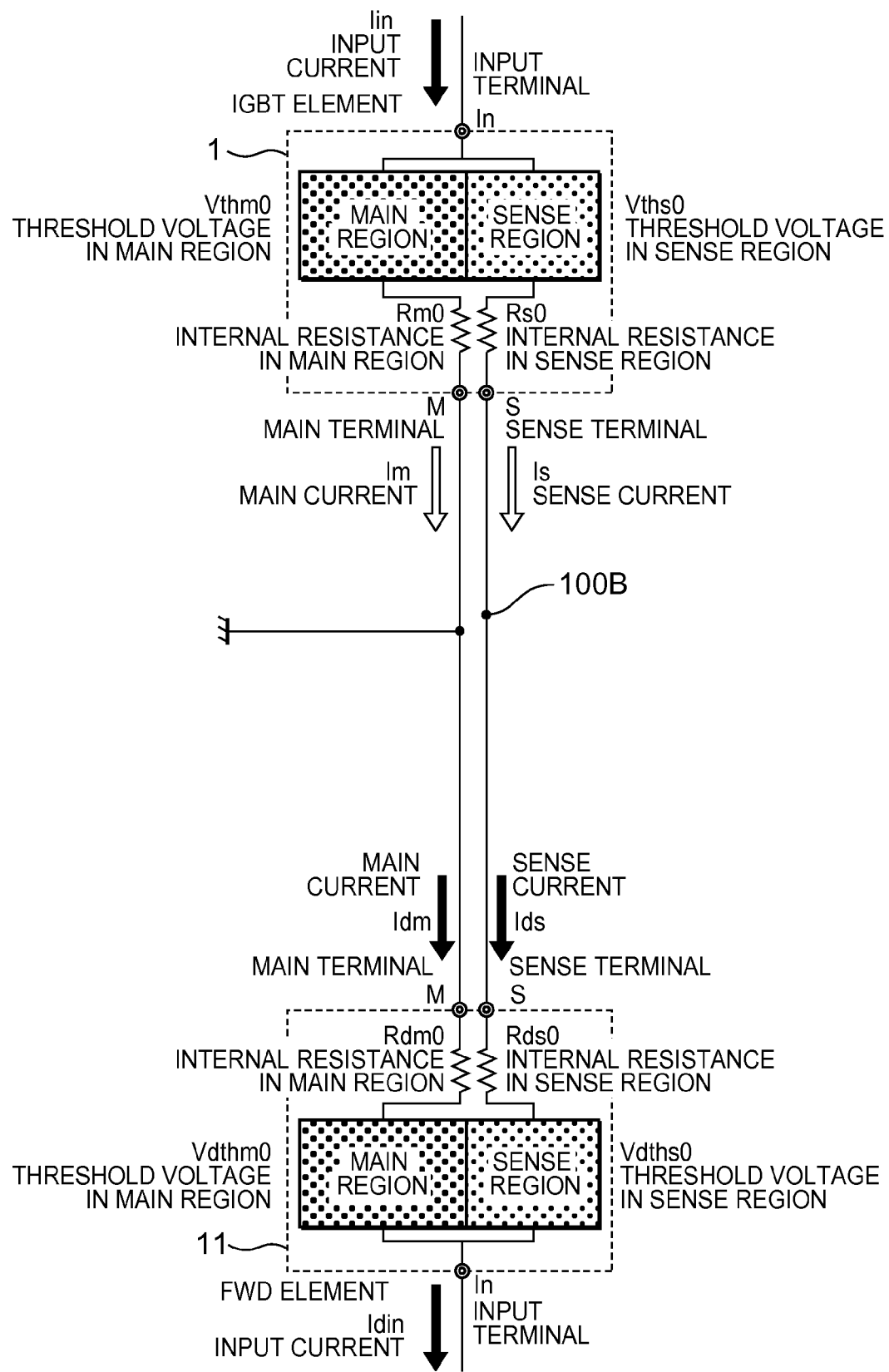
Figure 4:
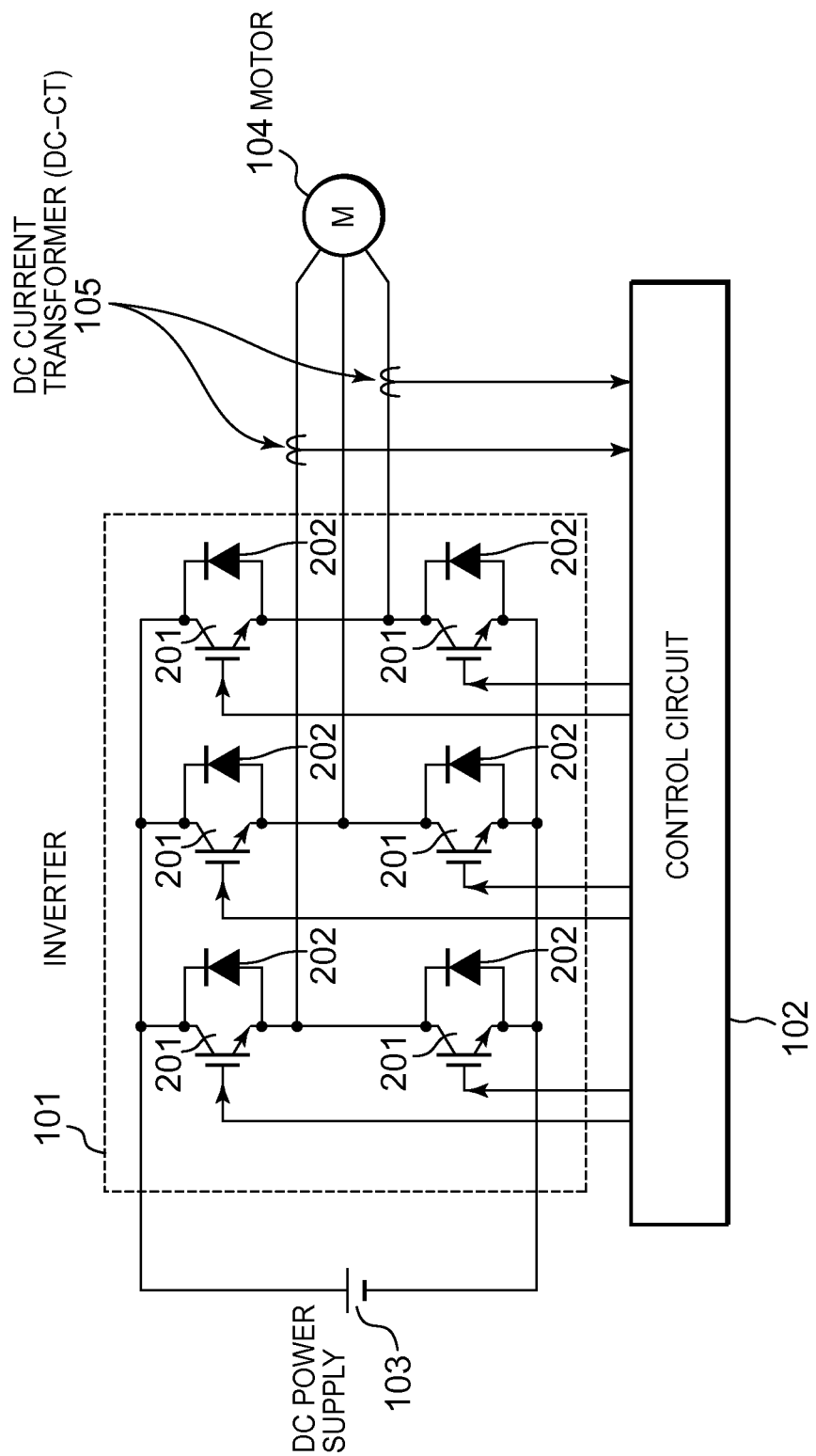
FIG. 4 shows a construction example of a conventional inverter apparatus employing DCCTs.
Figure 5:
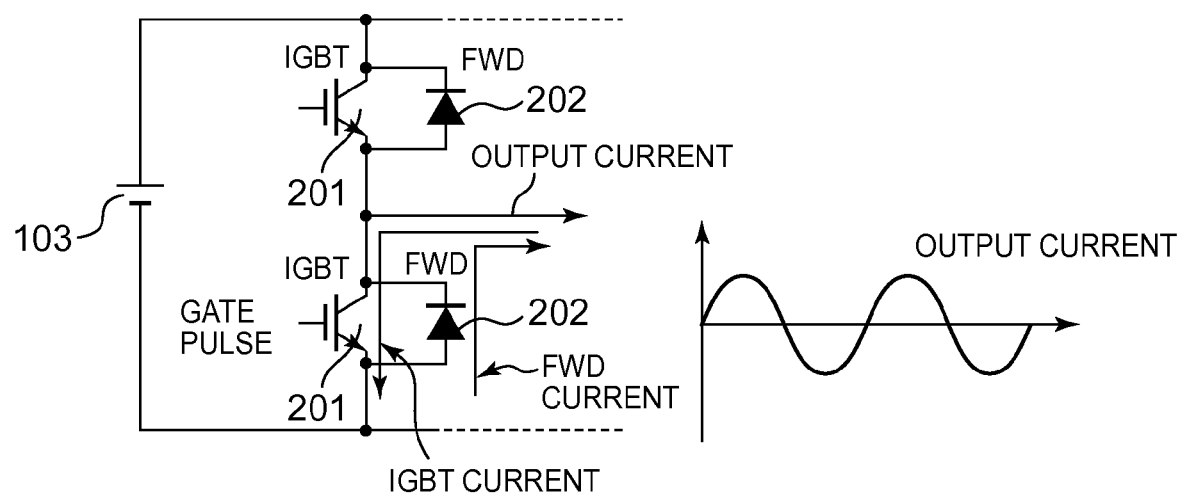
FIG. 5 shows relationship among IGBT current, FWD current, and output current in a lower arm of a one phase portion of a conventional inverter apparatus shown in FIG. 4.
Figure 6A:
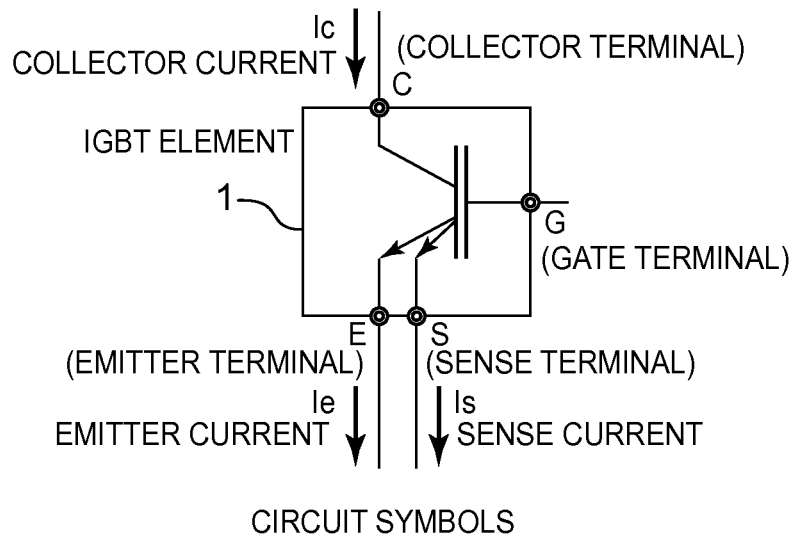
FIGS. 6(a) and 6(b) show circuit symbols (6(a)) and an equivalent circuit (6(b)) of a semiconductor device with a sense function in an example of an IGBT element.
Figure 6B:
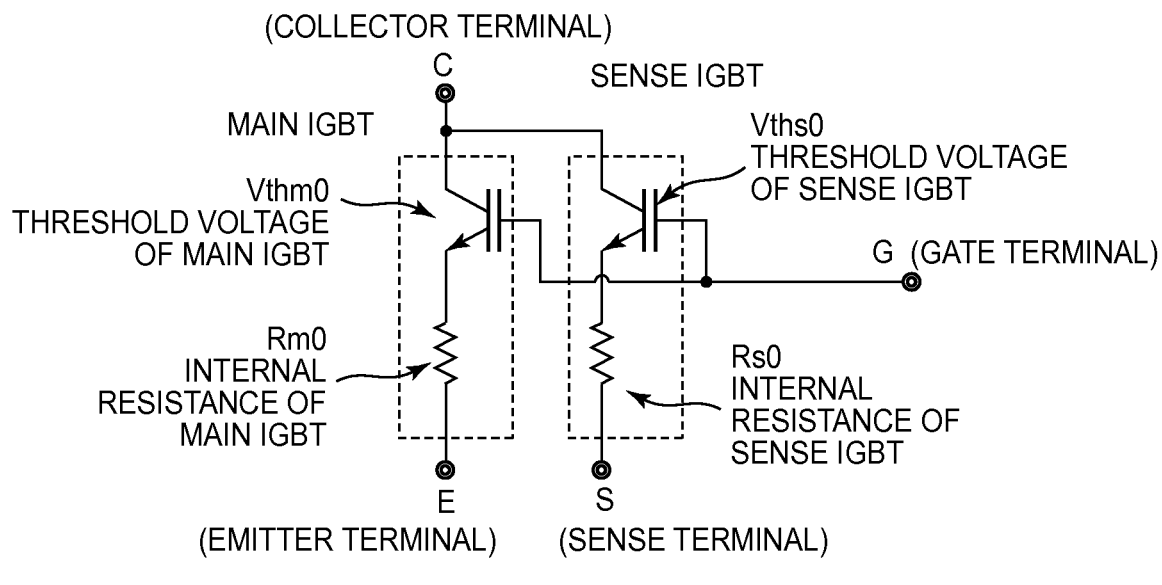
Figure 7:
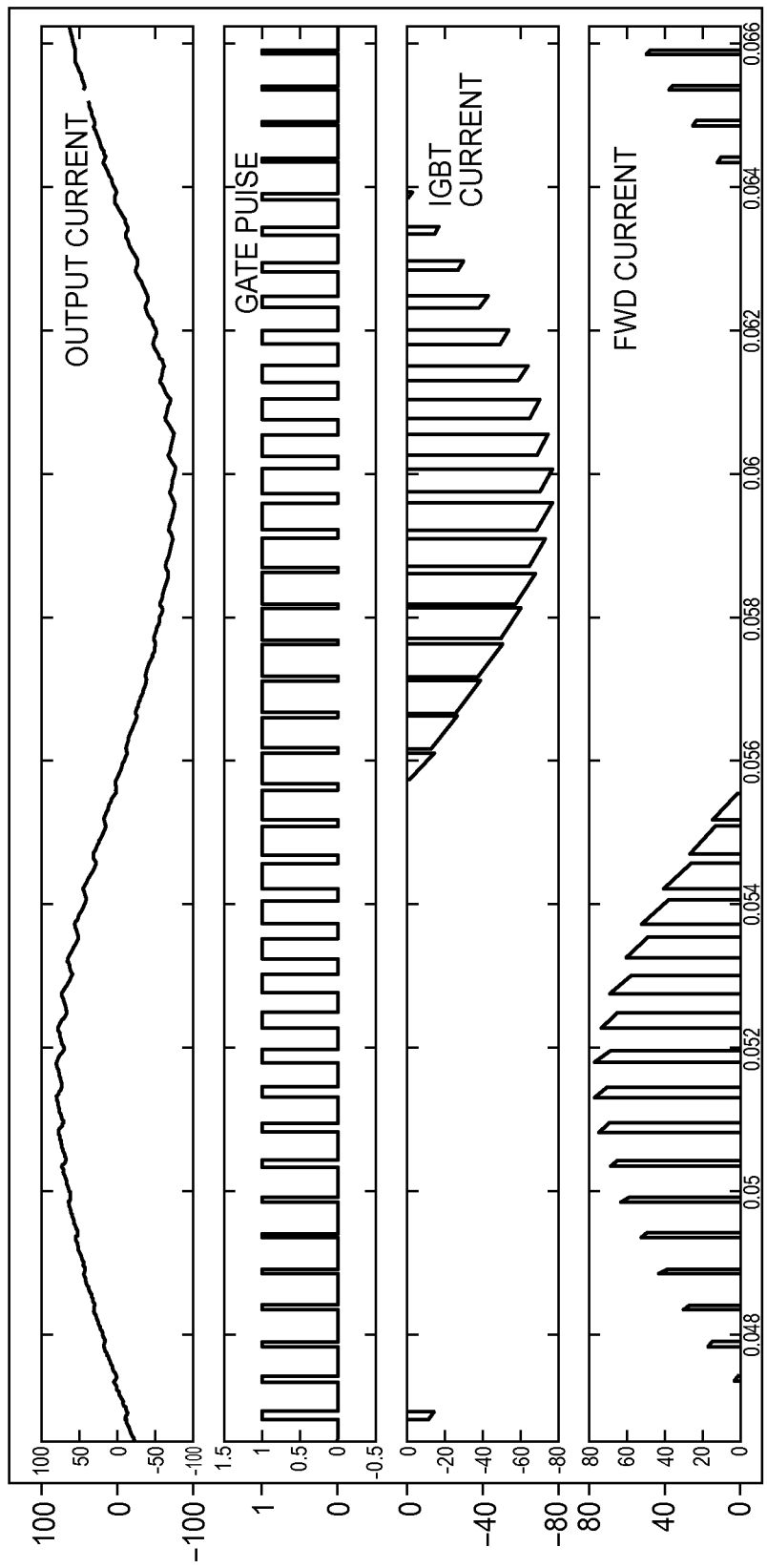
FIG. 7 shows simulation waveforms of an output current and currents in the IGBT and the FWD in a one phase portion of a conventional inverter apparatus.

FIG. 2A illustrates the detailed construction of a current detection circuit for a power semiconductor device for one phase in an embodiment according to the present invention. Referring to FIG. 2A, a current detection circuit 2 for a power semiconductor device of an embodiment according to the present invention receives an input signal at an input terminal 100A. The current detection circuit 2 comprises a current-voltage conversion circuit 24, a first variable voltage source circuit 22, a second variable voltage source circuit 23, an output level regulator 25, an adder circuit 26, and a current direction detection circuit 27. The input terminal 100A is connected to an output terminal 100B at a point between the sense terminal S of the IGBT element with a sense function 1 shown in the upper part of FIG. 2B and the sense terminal S of the FWD element with a sense function 11 shown in the lower part of FIG. 2B. The line between the sense terminals S, S is connected to the IGBT element 1 and the IGBT element 11 in parallel to the line between the main terminals M, M of the IGBT elements 1 and the FWD element 11. The output level adjustor 25 is composed of an adder circuit including an operational amplifier and resistors R2, R3 and R4, and adjusts a gain and an offset of a current sense output, which is an output from the current-voltage conversion circuit 24.

The current direction detection circuit 27 has a construction including a hysteresis comparator 271 having a non-inversion input terminal that is a positive (+) terminal connected to the output side of the current-voltage conversion circuit 24, and an inversion input terminal that is a negative (−) terminal connected to the GND (ground). An output signal from the current direction detection circuit 27, which is an output signal from the hysteresis comparator 271, is delivered to an externally disposed CPU 3.

Operation of the current direction detection circuit 27 is briefly described with reference to FIG. 3, which shows waveforms in operation of the current direction detection circuit 27 shown in FIG. 2A and the waveform of the output current. During the period when the output of the current-voltage conversion circuit 24 as shown in the middle of FIG. 3 is larger than the GND level, the output of the current direction detection circuit 27, which is the output of the hysteresis comparator 271, is at the high level 'Hi'. On the other hand, during the period when the output of the current-voltage conversion circuit 24 is smaller than the GND level, the output of the current direction detection circuit 27, which is the output of the hysteresis comparator 271, is at the low level 'Lo'.

During the period when the output of the current-voltage conversion circuit 24 is larger than the GND level, the output current flows in the direction to go out from the lower arm of the inverter apparatus. Since the current-voltage conversion circuit 24 outputs a positive voltage in this period (in the period when an electric current is flowing in the FWD), the comparator 271 outputs the Hi signal. Here, the output of the current-voltage conversion circuit 24 is not continuous but pulse width-modulated (PWM) because the power semiconductor element operates in a switching mode. When the FWD is in the OFF state, for example, the output of the current-voltage conversion circuit 24 is at the zero volt level due to absence of a sense current. In this state, the voltage levels of the two input signals to the comparator 271 are at the same order of magnitude. As a result, the output of the comparator 271 becomes unstable and the current direction detection circuit 27 may operate unstably. In order to avoid this unstable operation, hysteresis is set in the decision level of the comparator 271. When the output signal of the comparator 271 is at the 'Hi' level, for example, the decision level of the comparator 271 is slightly lowered to obtain a stable output of 'Hi' level.

When the direction of output current is altered to flow into the lower arm of the inverter apparatus, the output of the current-voltage conversion circuit 24 is lower than the GND level. Since the current-voltage conversion circuit 24 outputs a negative voltage in this period (in the period when an electric current is flowing in the IGBT), the comparator 271 outputs the 'Lo' level signal. Similarly to the case described above, the output of the current-voltage conversion circuit 24 is not continuous but pulse width modulated (PWM) because the power semiconductor element operates in a switching mode. When the IGBT is in the OFF state, the voltage levels of the two input signals to the comparator 271 are at the same order of magnitude. As a result, the current direction detection circuit 27 may operate unstably. In this case, different from the case of FWD current period described previously, the output signal of the comparator 271 is at the 'Lo' level and the decision level of the comparator 271 is slightly elevated to obtain a stable output signal of 'Lo' level. The operation described above allows the current direction detection circuit 27 to stably detect the direction of the current flowing through the sense terminal S. The inputs of the hysteresis comparator 271 can be exchanged and the current direction detection circuit is constructed with the output in a reversed logic.

The first variable voltage source circuit 22 shown in FIG. 2A is composed of two inverting amplifiers and an output gain adjustor 221. The output gain adjustor 221 comprises a ladder circuit connected to the output of the current-voltage conversion circuit 24 and a bit signal decoder that executes switching operation according to bit-setting corresponding to the digital signal, a gain setting signal, delivered by an external CPU 3. Although FIG. 2A illustrates an example with a resolution of 4 bits, the first variable voltage source circuit 22 is not limited to this construction. The second variable voltage source circuit 23 has a construction in which a reference potential delivering IC (integrated circuit) is added to the construction of the first variable voltage source circuit 22. The second variable voltage source circuit 23, having the reference potential delivering IC, is not connected to the current-voltage conversion circuit 24. The output offset adjustor 231 of the second variable voltage source circuit 23 comprises a ladder circuit connected to the added reference potential delivering IC and a bit signal decoder that executes switching operation according to bit-setting corresponding to the digital signal, an offset-setting signal, delivered by the external CPU. Although FIG. 2A illustrates an example with a resolution of 4 bits, the second variable voltage source circuit 23 is not limited to this construction. The output voltages of the first variable voltage source circuit 22 and the second variable voltage source circuit 23 are added by the adder circuit 26 having an operational amplifier and resistances R5, R6, and R7. The output signal of the adder circuit 26 is delivered to the reference voltage terminal (the '+' terminal) of the current-voltage conversion circuit 24. This circuit construction allows the electric potential at the sense terminal S to be fixed to the output voltage of the adder circuit 26 because the '−' terminal and the '+' terminal of the operational amplifier of the current-voltage conversion circuit 24 are virtually short-circuited. If the output voltage of the adder circuit 26 is zero volts, the electric potential at the sense terminal S is fixed to the GND potential irrespective of a magnitude of the sense current, eliminating an undesired effect of the voltage drop in a shunt resistor, which has been a problem in the conventional technology.

Further, for the output voltage of the adder circuit 26 to vary according to the current value detected by the current-voltage conversion circuit 24, a gain Kg and an offset Ko are set according to a gain-setting signal and an offset-setting signal that are delivered by the external CPU 3. As described previously, the Kg is set as a parameter for correcting an internal resistance difference and the Ko is set as a parameter for correcting an internal threshold voltage difference. Thus, the voltage Vs at the sense terminal S varies corresponding to the current flowing in the IGBT in accordance with the following equation:

$$Vs = Kg \times Is + Ko$$

where Kg is the gain and Ko is the offset. Since the gain Kg and the offset Ko function as a virtual resistance and a virtual offset voltage, respectively, correction for difference in characteristics of the main region and the sense region can be executed by adjusting the parameters to satisfy the following formulas:

$$Rm0 \approx Rs0 + Kg$$

$$Vthm0 \approx Vths0 + Ko$$

where
Rm0 is an internal resistance of the main region,
Rs0 is an internal resistance of the sense region,
Vthm0 is a threshold voltage of the main region, and
Vths0 is a threshold voltage of the sense region.
The gain Kg and the offset Ko can be set to either a positive value or a negative value according to the gain-setting signal and the offset-setting signal delivered by the external CPU 3.

The gain Kg and the offset Ko are for the case of a current flowing in the IGBT element 1. For the case of a current flowing in the FWD 11, the similar procedure of consideration is appropriate. The voltage Vds at the sense terminal S varies corresponding to the current flowing in the FWD in accordance with the following equation:

$$Vds = Kg \times Ids + Ko$$

where Kg is the gain and Ko is the offset. Since the gain Kg and the offset Ko function as a virtual resistance and a virtual offset voltage, respectively, correction of difference in characteristics of the main region and the sense region can be executed by adjusting the parameters to satisfy the following formulas:

$$Rdm0 \approx Rds0 + Kg$$

$$Vdthm0 \approx Vdths0 + Ko$$

where
Rdm0 is an internal resistance of the main region,
Rds0 is an internal resistance of the sense region,
Vdthm0 is a threshold voltage of the main region, and
Vdths0 is a threshold voltage of the sense region.

The following describes overall operation of the current detection circuit for a power semiconductor device of the embodiment shown in FIG. 2A according to the present invention. The first variable voltage source circuit 22 receives a voltage Vi that is an output of the current-voltage conversion circuit 24 and outputs a voltage in the range of −Vi to +Vi (corresponding to the gain Kg of −1 to +1) according to setting of a bit signal based on the gain-setting signal from the external CPU 3. The second variable voltage source circuit 23 receives a voltage Vref that is an output of the reference potential delivering IC and outputs a voltage in the range of −Vref to +Vref (corresponding to the offset Ko of −1 to +1) according to setting of a bit signal based on the offset-setting signal from the external CPU 3.

Thus, an output of the first variable voltage source circuit 22 and an output of the second variable voltage source circuit 23 can be adjusted based on a gain-setting signal and an offset-setting signal from the external CPU 3. The differences in the characteristics of the main region and the sense region of a power semiconductor device with a sense function can be considered approximately as differences in the threshold voltages Vthm0, Vths0; and Vdthm0, Vdths0, and differences in internal resistances Rm0, Rs0; and Rdm0, Rds0. By executing correction on the threshold voltages and the internal resistances, improved linearity and enhanced current detection precision are attained. This issue is described more in detain in the following.

As illustrated in FIG. 3, the output current in the lower arm of the inverter apparatus is divided into the one in the period an electric current is flowing in the IGBT and the one in the period an electric current is flowing in the FWD. In the period when the current-voltage conversion circuit 24 outputs a voltage lower than the GND level, that is, a negative voltage, the output current flows into the lower arm of the inverter apparatus through the IGBT. Linearity correction is executed in this period for the main current Im and the sense current Is in the IGBT element 1, as follows.

In the current detection circuit 2 of the invention, the output voltage of the first variable voltage source circuit 22 allows to set the gain Kg adjusting the output gain adjuster 221 by the gain-setting signal from the external CPU 3 in order for the output voltage of the first variable voltage source circuit 22 to vary corresponding to the current that is detected by the current-voltage converter circuit 24. The output voltage of the second variable voltage source circuit 23 allows setting the offset Ko by adjusting the output offset adjuster 231 according to the offset-setting signal from the external CPU 3.

The output of the first variable voltage source circuit 22 and the output of the second variable voltage source circuit 23 are added based on the gain factor K1 and the offset factor K2 that are set in the manner as described above. The added output is represented by the following equations:

$$Vs = (R7/R5) \times (R1 \times Is) \times K1 + (R7/R6) \times Vref \times K2$$
$$= \{(R7/R5) \times R1 \times K1\} \times Is + \{(R7/R6) \times Vref \times K2\}$$

Thus, the gain Kg is a factor to represent a virtual resistance and the offset Ko—is a factor to represent a virtual offset voltage. The added output from the adder circuit 26 is connected to the '+' terminal, a reference terminal, of the operational amplifier provided in the current-voltage conversion circuit 24. The output from the operational amplifier of the current-voltage conversion circuit 24 is given to the '−' terminal that is virtually short-circuited with the '+' terminal, and thus, eventually becomes an electric potential at the sense terminal S.

The gain Kg and the offset gain Ko here are adjusted by the external CPU 3 so as to satisfy the following formulas:

$$Rm0 \approx Rs0 + \{(R7/R5) \times R1 \times K1\}$$

$$Vthm0 \approx Vths0 + \{(R7/R6) \times Vref \times K2\}$$

Thus, correction for the characteristics difference between the main region and the sense region of the IGBT 1 is performed to make the Im-Is characteristic linear.

In the period an electric current flows in the FWD 11 in the lower arm, linearity correction of the main current Idm and the sense current Ids in the FWD element 11 is executed as described in the following. In this period, the output current flows out of the lower arm of the inverter apparatus and the output of the current-voltage conversion circuit 24 is higher than the GND level and a positive voltage.

In the current detection circuit 2 of the invention, the output voltage of the first variable voltage source circuit 22 allows to set the gain Kg adjusting the output gain adjuster 221 according to the gain-setting signal from the external CPU 3 in order to vary corresponding to the current that is detected by the current-voltage converter circuit 24. The output voltage of the second variable voltage source circuit 23 allows setting the offset Ko adjusting the output offset adjuster 231 according to the offset-setting signal from the external CPU 3.

The output of the first variable voltage source circuit 22 and the output of the second variable voltage source circuit 23 are added based on the gain Kg and the offset Ko that are set in the manner as described above. The added output is represented by the following equations:

$$Vds = (R7/R5) \times (R1 \times Ids) \times K1 + (R7/R6) \times Vref \times K2$$
$$= \{(R7/R5) \times R1 \times K1\} \times Ids + \{(R7/R6) \times Vref \times K2\}$$

Thus, the gain Kg is a factor to represent a virtual resistance and the offset Ko is a factor to represent an offset voltage. The added output from the adder circuit 26 is delivered to the '+' terminal, a reference terminal, of the operational amplifier provided in the current-voltage conversion circuit 24. The output from the operational amplifier of the current-voltage conversion circuit 24 is given to the '−' terminal that is virtually short-circuited with the '+' terminal, and thus, eventually becomes an electric potential at the sense terminal S.

The gain Kg and the offset Ko here are adjusted by the external CPU 3 so as to satisfy the following formulas:

$$Rdm0 \approx Rds0 + \{(R7/R5) \times R1 \times K1\}$$

$$Vdthm0 \approx Vdths0 + \{(R7/R6) \times Vref \times K2\}$$

Thus, correction for the difference in characteristics between the main region and the sense region of the FWD 11 is performed to make the Idm-Ids characteristic linear.

The external CPU 3 outputs a gain-setting signal and an offset-setting signal corresponding to the output signal from the current direction detection circuit 27. When the output signal of the current direction detection circuit 27 is at a 'Hi' level, the external CPU 3 gives a gain-setting signal and an offset-setting signal for the FWD; and when the output signal of the current direction detection circuit 27 is at a 'Lo' level, the external CPU 3 gives a gain-setting signal and an offset-setting signal for the IGBT. Thus, only one current detection circuit as shown in FIG. 2 is sufficient to perform correction for the difference in characteristics difference between the main region and the sense region of both of the FWD and the IGBT to improve linearity in the both semiconductor elements.

As described thus far, current detection circuits that have been provided individually for sense IGBT current detection and for sense FWD current detection are replaced by a single common current detection circuit of the present invention. The current detection circuit operates in a time-sharing manner to perform correction for sense IGBT current detection and correction for sense FWD current correction. Therefore, the current detection precision of a power semiconductor device is improved without enlarging a circuit scale.

A current detection circuit of the present invention can be applied not only to the inverter apparatus as described above but also to a chopper circuit provided with a power semiconductor device, for example, a pair of an IGBT element and an FWD element.

What is claimed is:

1. A current detection circuit for a power semiconductor device having a sense function, the power semiconductor device including a main region and a sense region for current detection and including a main terminal connected to the main region, and a sense terminal connected to the sense region, the current detection circuit comprising:
    a current-voltage conversion circuit that is coupled to the sense terminal of the power semiconductor device to receive a current to be detected and that converts the current to a voltage signal;
    an output level regulator that regulates an output level of a current sense signal delivered from the current-voltage conversion circuit;
    a current direction detection circuit that detects a direction of a current flowing in the power semiconductor device with a sense function based on a current sense signal delivered from the current-voltage conversion circuit and that provides a direction signal to an external CPU;
    a first variable voltage source circuit that generates a correction gain according to a gain-setting signal delivered by the CPU and corresponding to the direction of the current flowing in the power semiconductor device with a sense function;
    a second variable voltage source circuit that generates a correction offset according to an offset-setting signal delivered by the CPU and corresponding to the direction of the current flowing in the power semiconductor device with a sense function; and
    an adder circuit that adds an output of the first variable voltage source circuit and an output of the second variable voltage source circuit and supplies an added result to the current-voltage conversion circuit;
    wherein an electric potential at the sense terminal is adjusted corresponding to the added result to perform correction for a difference between a characteristic of the main region and a characteristic of the sense region.

2. The current detection circuit for a power semiconductor device according to claim 1, wherein the current direction detection circuit comprises a comparator with a hysteresis function having two input terminals, one of which is connected to GND and the other is connected to an output of the current-voltage conversion circuit, and detects the direction of the output current flowing in the power semiconductor device with a sense function corresponding to the output level of the current-voltage conversion circuit.

3. The current detection circuit for a power semiconductor device according to claim 1,
wherein the power semiconductor device with a sense function is an IGBT with a sense function, and
wherein the CPU outputs a gain-setting signal and an offset-setting signal for the IGBT to perform correction for the difference between a characteristic of the main region and a characteristic of the sense region of the IGBT.

4. The current detection circuit for a power semiconductor device according to claim 1,
wherein the power semiconductor device with a sense function is an FWD with a sense function, and
wherein the CPU outputs a gain-setting signal and an offset-setting signal for the FWD to perform correction for the difference between a characteristic of the main region and a characteristic of the sense region of the FWD.

5. An inverter apparatus comprising:
an upper arm and a lower arm, each arm including an IGBT and an FWD, the IGBT in the lower arm being an IGBT with a sense function and the FWD in the lower arm being an FWD with a sense function, the IGBT with a sense function having a first sense terminal and the FWD with a sense function having a second sense terminal that is connected to the first sense terminal at a connection node;
a CPU; and
a current detection circuit that is connected to the connection node, the current detection circuit including
a current-voltage conversion circuit that is coupled to the connection node to receive a current to be detected and that converts the current to a voltage signal;
an output level regulator that regulates an output level of a current sense signal delivered from the current-voltage conversion circuit;
a current direction detection circuit that detects a direction of a current flowing in the lower arm based on a current sense signal delivered from the current-voltage conversion circuit and that provides a direction signal to the CPU;
a first variable voltage source circuit that generates a correction gain according to a gain-setting signal delivered by the CPU and corresponding to the direction of the current flowing in the lower arm;
a second variable voltage source circuit that generates a correction offset according to an offset-setting signal delivered by the CPU and corresponding to the direction of the current flowing in the lower arm; and
an adder circuit that adds an output of the first variable voltage source circuit and an output of the second variable voltage source circuit and supplies an added result to the current-voltage conversion circuit;
wherein an electric potential at the connection is adjusted corresponding to the added result.

* * * * *